June 5, 1962 W. M. HANCOCK 3,037,274

METHODS OF AND APPARATUS FOR MASS SOLDERING WIRING BOARDS

Filed March 6, 1957 3 Sheets-Sheet 1

Inventor
W.M. HANCOCK
By W. L. Johnson
Attorney

METHODS OF AND APPARATUS FOR MASS SOLDERING WIRING BOARDS

Filed March 6, 1957 3 Sheets-Sheet 2

Inventor
W.M. HANCOCK
By W. A. Robinson
Attorney

June 5, 1962 W. M. HANCOCK 3,037,274

METHODS OF AND APPARATUS FOR MASS SOLDERING WIRING BOARDS

Filed March 6, 1957 3 Sheets-Sheet 3

Inventor
W.M. HANCOCK
By W. A. Johnson
Attorney

United States Patent Office 3,037,274
Patented June 5, 1962

3,037,274
METHODS OF AND APPARATUS FOR MASS SOLDERING WIRING BOARDS

William M. Hancock, Groveland, Mass., assignor to Western Electric Company, Incorporated, New York, N.Y., a corporation of New York Filed Mar. 6, 1957, Ser. No. 644,239
4 Claims. (Cl. 29—471.1)

This invention relates to methods of and apparatus for mass soldering, particularly the simultaneous soldering of a multiplicity of electrical component leads to their respective circuits of wiring boards.

Wiring boards, which are now widely used in the electrical field, include panel-like structures of predetermined sizes composed of dielectric material with sufficient rigidity to support numerous electrical components mounted on like faces of the wiring boards and having their leads extending through apertures in the boards and bent into contact with predetermined portions of wiring circuits printed or otherwise formed on the faces of the boards. The wiring circuits frequently differ from each other depending upon the functions the circuits and their electrical components are to perform. For these reasons, no standard means may be provided for depositing molten solder at the varying positions the component leads may be connected in the various circuits. Attempts have been made to mass solder the leads but there are always the problems of supplying solder free of dross and only that amount needed to complete the soldering operation and to avoid short circuiting of any of the lead or wiring portions.

The objects of the present invention are a method of and apparatus for rapidly and efficiently mass soldering electrical component leads to their respective circuits of wiring boards.

In accordance with the objects of the invention, one embodiment thereof includes a method of forming a stream of molten solder of a width at least equalling the width of the wiring boards, causing the stream to flow in a given plane and lowering the wiring boards successively toward the stream until the wiring circuits and the adjacent lead portions are submerged in the stream.

The apparatus by the aid of which the method may be practiced includes a receptacle for a molten solder bath, a table supported above the bath and having means to form a stream of solder from the bath and cause it to flow in a given plane over the table whereby the wiring boards may be lowered successively toward the stream until the wiring circuits thereof and the adjacent lead portions are submerged in the stream.

Other objects and advantages will be apparent from the following detailed description when considered in conjunction with the accompanying drawings, wherein.

Figure 1:
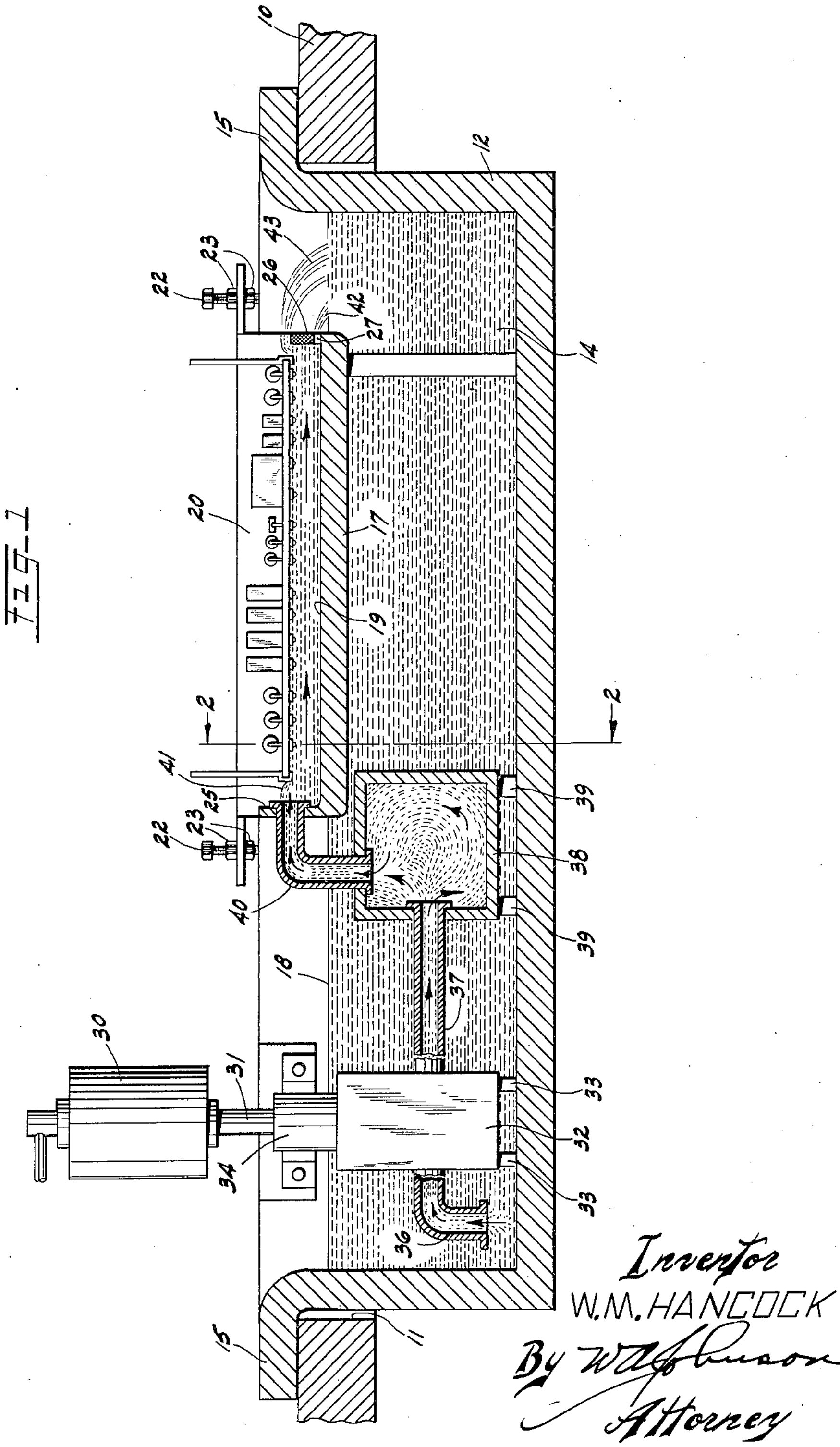
FIG. 1 is a vertical sectional view of the apparatus, portions thereof being shown in elevation.

Referring now to the drawings, the apparatus by the aid of which the method may be practiced includes a table 10 apertured at 11 to receive and support a receptacle 12 for a bath 14 of molten solder. The receptacle 12 has flanged portions 15 to rest upon the table 10 and may otherwise be of the conventional solder pot structure equipped with means (not shown) to heat the solder to and maintain it at, a predetermined temperature, for example, 480° F.

A solder stream support 17 of a desired thickness is positioned within the receptacle 12 to extend a short distance below the surface 18 of the solder bath 14 so as to be heated by the solder in the bath while the upper face 19 of the support is positioned above the surface 18. The support 17 has side walls 20 which extend vertically like distances to positions above the receptacle and laterally over the side flanges 15 of the receptacle. Apertures 21 are formed in the lateral portions of the side walls 20 to receive adjusting screws 22 so that, through the aid of the adjusting screws and lock-nuts 23 mounted thereon, the position of the support 17 relative to the surface 18 of the solder bath may be varied. The adjusting screws rest upon the side flanges 15 of the receptacle and serve as legs for the support. The support 17 is also provided with a wall 25 at an entrance end thereof and a dam 26 at the exit end. The dam 26 in the present instance is composed of a screen-like structure raised a small distance, indicated at 27, from the face 19 of the table and extending upwardly to a given distance above the table to control the depth of a stream of solder forced in the directions of the arrows (FIG. 1) over the support.

The means for forcing the stream of solder over the support originates with the motor 30 driven under suitable controls to cause its drive shaft 31 to drive a pump 32. The pump which may be of any type suitable for pumping molten solder, is supported at 33 in the solder bath 14 in the receptacle 12 and the shaft 31 extends through suitable bearings in a bearing bracket 34 fixed to a portion of the receptacle.

Figure 2:
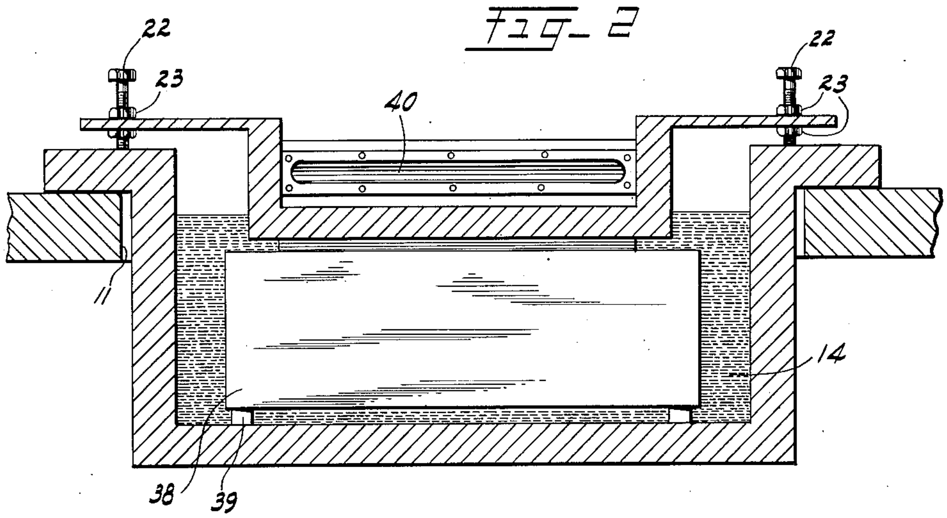
FIG. 2 is a vertical sectional view taken along the line 2—2 of FIG. 1.
Figure 3:
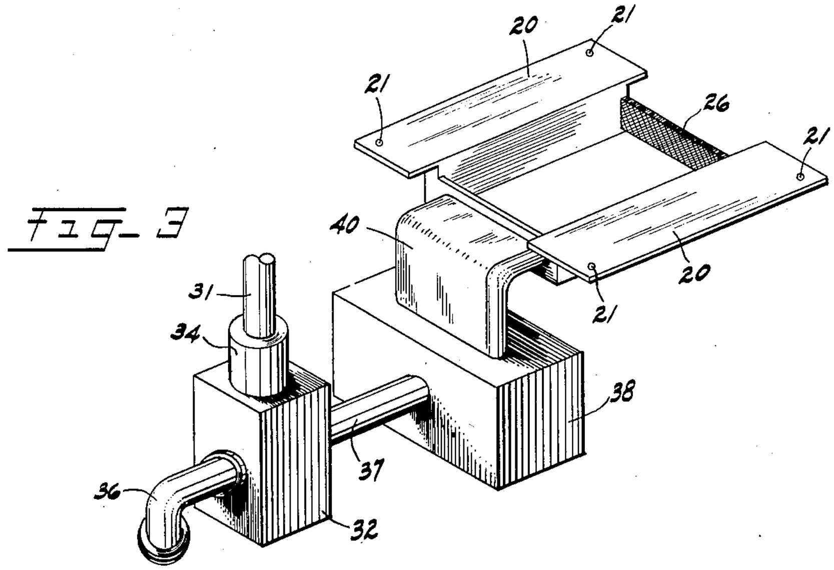
FIG. 3 is a schematic isometric view of the table structure and the associated means for forcing solder over the table.

A pipe 36 represents the intake of the pump 32 and is bent to have its opening disposed near, but above, the bottom of the solder bath in the receptacle. A pipe 37 extends from the outlet of the pump 32 to a pressure tank 38. The pressure tank 38 is supported at 39 in the solder bath in the receptacle and has a connecting member 40 which may be identified as a nozzle forming communication between the pressure tank 38 and the entrance end of the support 17 through wall 25. The nozzle 40, as shown in FIGS. 2 and 3, is substantially equal in width to the width of the face 19 of the support and has its outlet terminating substantially in a plane with the upper surface of the stream 41 of solder to be forced over the table after which it will spill back into the solder bath as indicated by the streams 42 and 43.

Figure 4:
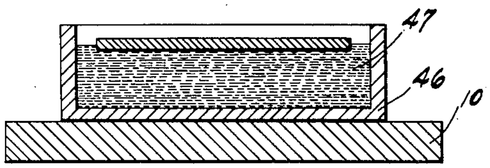
FIG. 4 is a vertical sectional view of a flux bath.

In FIG. 4, a receptacle 46 for a flux bath 47 is mounted at a convenient position on the table 10 with respect to the receptacle 12 for the solder bath 14.

Figure 5:
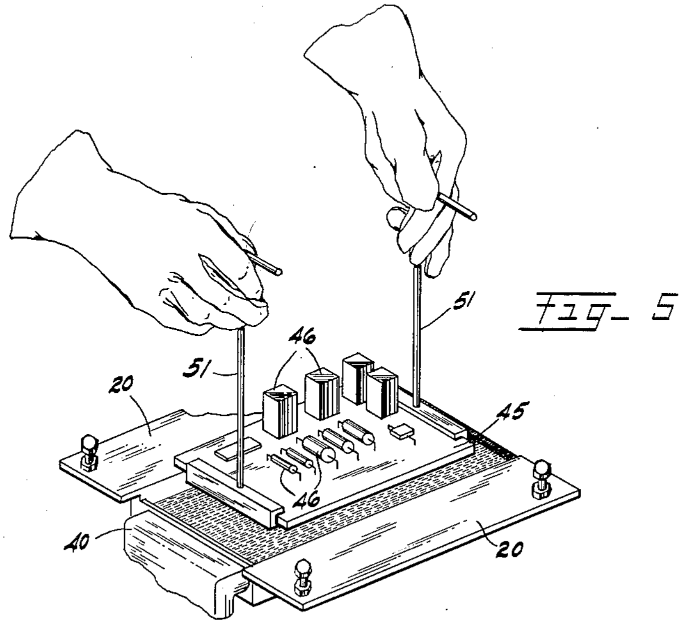
FIG. 5 is a fragmentary isometric view of a portion of the apparatus illustrating the dipping of a wiring board with its electrical components partially in the stream of molten solder.
Figure 6:
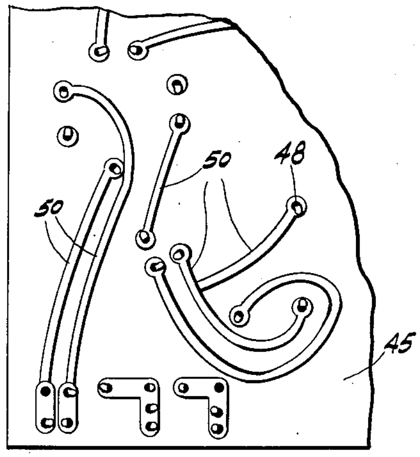
FIG. 6 is a fragmentary bottom plan view of a wiring board prior to soldering.
Figure 7:
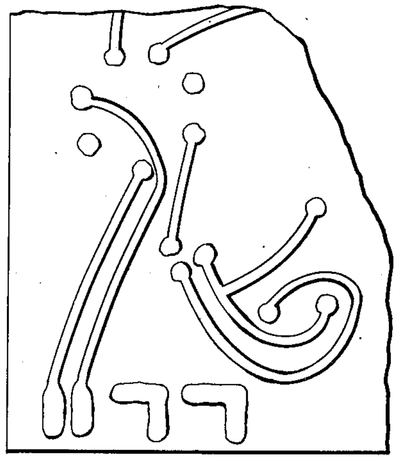
FIG. 7 is a view of the structure shown in FIG. 6 after the soldering operation.
Figure 8:
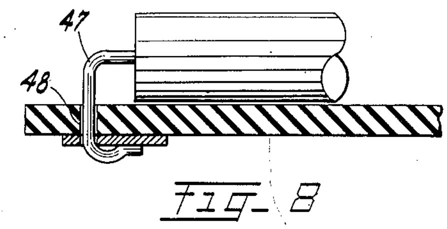
FIG. 8 is a fragmentary sectional view illustrating the mounting of an electrical component on a wiring board.

In the present illustration, the apparatus is for use in practicing the method of mass soldering wiring board circuits and their connections with the leads of the various electrical components mounted thereon. The wiring boards may be similar in size and material but at this point the similarity ceases in that the wiring circuits vary extensively with the numbers and types of electrical components employed. In FIG. 5 a wiring board 45 has an arrangement of electrical components 46 mounted upon one surface thereof with the leads 47 extending through apertures 48 (FIGS. 6 and 8) and the ends of the leads bent back into engagement with adjacent portions of electrical circuits 50 printed or otherwise formed on the bottom surface of the wiring board. A portion of one arrangement of circuits is illustrated in FIG. 6 while FIG. 7 illustrates the desired result through the practice of the method and the use of the apparatus for mass soldering the wiring circuits and the connections of the leads of the electrical components therewith. Any suitable means, such as holders 51, may be employed in engaging opposing edges of the successive wiring boards 45 and lowering them first into the flux bath (FIG. 4) so that the wiring boards will have only their lower portions entering the flux baths to cover the wiring circuits and the connecting portions of the leads 47. The wiring board in the same manner may be lowered toward the stream 41 of the molten solder to a position illustrated in FIG. 1 where a wiring board with another arrangement of components is illustrated to position the wiring circuits 50 thereof and the adjacent portions of the leads 47 in the stream of solder so that all portions of the circuits and lead portions connected thereto will be soldered simultaneously.

During the operation of the apparatus, any dross on the solder bath will not be included in the stream 41 of solder. This is due to the fact that, with the exception of the motor 30 and its drive shaft 31, the means for removing solder from the bath 14 and forcing it in a continuous stream at a predetermined speed and at a controlled depth and width over the plane of the surface 19 of the support 17, is disposed in the solder bath. The pump 32 selects solder from the lower portion of the bath and forces it in the direction of the arrows into the pressure tank 38 to build up and maintain the pressure of the molten solder in the tank sufficient to cause the wide flow of solder through the nozzle 40 at the desired rate without any turbulance in stream over the face 19 of the support. This action results in a dross-free stream of solder continuously moving so that when the approximately stationary objects, namely the successive wiring boards, are disposed a given distance in the stream, all metallic portions exposed to the stream of solder will be covered instantaneously with the solder, making possible a rapid mass soldering operation requiring at the most, four seconds for each mass soldering operation. These method steps may be repeated in rapid succession and the soldered wiring boards may be positioned at any desired location for the solder to cool and solidify on the wiring circuits and the adjacent leads 47 as illustrated in FIG. 7. Actually the leads cannot be observed from viewing FIG. 7 as they have been covered with solder together with the adjacent wiring portions of the circuit.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

1. The method of mass soldering electrical component leads to their respective circuits of wiring boards wherein the leads extend from their components, mounted on like faces of the wiring boards, through apertures in the wiring boards and engage their respective portions of wiring circuits formed on the faces of the wiring boards opposing said like faces, the method comprising positioning a solder stream support, of greater width and length than the wiring boards, on an upper surface of a bath of molten solder so that the support will be heated thereby, causing the molten solder from a portion below the upper surface of the bath to form a stream of a width equaling the width of the support, causing the stream to flow only in one direction in a given plane and at a given depth over the support, continuing the stream in said plane a distance greater than the length of the wiring boards, and lowering the wiring boards successively toward the stream until the wiring circuits thereof and the adjacent lead portions are submerged in the stream.

2. An apparatus for mass soldering electrical component leads to their respective circuits of wiring boards wherein the leads extend from their components mounted on like faces of the wiring boards, through apertures in the wiring boards and engage their respective portions of wiring circuits formed on faces of the wiring boards opposing said like faces, the apparatus comprising a heated receptacle for a bath of molten solder, a solder stream support partially submerged in the bath of solder and having an upper planar surface and vertically extending side walls positioned above the bath, means to remove solder from the bath beneath the surface thereof, and means to cause the removed solder to flow in a wide stream over the upper face of the support so that the wiring boards may be lowered successively toward the stream until the wiring circuits thereof and the adjacent lead portions are submerged in the stream.

3. An apparatus for mass soldering according to claim 2 in which the solder removing means includes a nozzle having an outlet disposed adjacent one end of the solder stream support and being substantially equal in width to the support to direct a stream of solder over the width of the support.

4. An apparatus for mass soldering according to claim 3 in which a pump is operable to remove the solder for the stream from the bath, and a pressure tank disposed in the bath and interposed between the pump and the nozzle to receive the solder for the nozzle under a predetermined pressure.

References Cited in the file of this patent

UNITED STATES PATENTS

| | | |
|---|---|---|
| 900,118 | Odquist | Oct. 6, 1908 |
| 1,365,291 | Stevens et al. | Jan. 11, 1921 |
| 1,446,667 | Schulz | Feb. 27, 1923 |
| 1,947,689 | Young | Feb. 20, 1934 |
| 2,344,589 | Bogner | Mar. 21, 1944 |
| 2,469,392 | Jones et al. | May 10, 1949 |
| 2,495,961 | Goldston | Jan. 31, 1950 |
| 2,579,634 | Warren | Dec. 25, 1951 |
| 2,739,567 | Jones et al. | Mar. 27, 1956 |
| 2,740,193 | Pessel | Apr. 3, 1956 |
| 2,756,485 | Abramson et al. | July 31, 1956 |
| 2,771,852 | Iles | Nov. 27, 1956 |
| 2,821,959 | Franz | Feb. 4, 1958 |

FOREIGN PATENTS

| | | |
|---|---|---|
| 712,109 | Great Britain | July 21, 1954 |
| 200,151 | Australia | July 7, 1955 |